(12) United States Patent
Thomas

(10) Patent No.: US 7,161,812 B1
(45) Date of Patent: Jan. 9, 2007

(54) SYSTEM FOR ARRAYING SURFACE MOUNT GRID ARRAY CONTACT PADS TO OPTIMIZE TRACE ESCAPE ROUTING FOR A PRINTED CIRCUIT BOARD

(75) Inventor: Simon A. Thomas, Cardiff (GB)

(73) Assignee: Nvidia Corporation, Santa Clara, CA (US)

( * ) Notice: Subject to any disclaimer, the term of this patent is extended or adjusted under 35 U.S.C. 154(b) by 197 days.

(21) Appl. No.: 10/442,355

(22) Filed: May 20, 2003

Related U.S. Application Data

(60) Provisional application No. 60/461,462, filed on Apr. 8, 2003.

(51) Int. Cl.
*H05K 7/02* (2006.01)
(52) U.S. Cl. ............... 361/777; 361/780; 361/794; 174/255; 174/261
(58) Field of Classification Search ............ 174/250, 174/260–261, 255; 361/760, 777, 780, 794; 257/700–703
See application file for complete search history.

(56) References Cited

U.S. PATENT DOCUMENTS 6,111,756 A * 8/2000 Moresco .................. 361/735
6,198,635 B1 * 3/2001 Shenoy et al. ............ 361/760

* cited by examiner

*Primary Examiner*—Kamand Cuneo
*Assistant Examiner*—Yuriy Semenenko

(57) ABSTRACT

A surface mount grid array implemented on a PCB (printed circuit board) optimized for trace escape routing for the PCB. The surface mount grid array includes a plurality of connection blocks, with each connection block including an array of pins and an array of vias, wherein the pins and vias are configured to communicatively connect an integrated circuit device to a plurality of traces of the PCB. The connection blocks are disposed in a tiled arrangement, wherein the connection blocks implement a plurality of trace escape channels along connection block boundaries. The trace escape channels are configured for routing traces from inner pins of the surface mount grid array to a periphery of the surface mount grid array.

10 Claims, 8 Drawing Sheets

SYSTEM FOR ARRAYING SURFACE MOUNT GRID ARRAY CONTACT PADS TO OPTIMIZE TRACE ESCAPE ROUTING FOR A PRINTED CIRCUIT BOARD

This application is a continuation of and claims the benefit of application(s) No. 60/461,462 filed on April 8, 2003, now abandoned, and which designated in the U.S.

FIELD OF THE INVENTION

The field of the present invention pertains to electronic integrated circuits. More particularly, the present invention relates to printed circuit board interfaces.

BACKGROUND OF THE INVENTION

Modern computer systems usually feature powerful digital processor integrated circuit devices. The processors are used to execute software instructions to implement complex functions, such as, for example, 3-D graphics applications, voice recognition, data visualization, and the like. Generally, the processors are configured with many different arrangements of memory, and other types of support or peripherals devices, on printed circuit boards. The specific configuration of processor, memory, peripheral device, etc. is usually dictated by the specific application of the overall device. Each configuration generally uses a printed circuit board, or motherboard, in order to interconnect the various components of the device.

As known by those skilled in the art, a printed circuit board (PCB) generally comprises a flat board that holds chips and other electronic components. The board is made of a plurality of layers that interconnect components via copper pathways.

Generally, PCBs are fabricated as an etched circuit on a fiberglass or plastic base. For example, a copper foil is placed over the base and covered with a photoresist. Light is shined through a negative image of the circuit paths onto the photoresist, hardening the areas that will remain after etching. After etching, the unhardened areas are washed away, leaving the circuit paths. The base is then finished (e.g., prepared for soldering, silk-screening, etc.) and the various integrated circuit components mounted.

As the complexity of integrated circuit technology has increased, the sophistication and complexity of PCB technology has also increased. For example, while the PCB of the 1970s connected discrete components together, more recent PCBs are used to interconnect chips, each containing millions of elementary components. Such highly integrated chips often have several hundred signal pins which must be interconnected with the other components of the PCB. Each of the signal interconnects have associated tolerances which define the manner in which they can be placed on the PCB in order to minimize the effects of, for example, crosstalk, EMI (electromagnetic interference) emissions, capacitance, signal skew, and the like. Because of these constraints, the PCB area for routing the signal traces (e.g., the conductor lines on the PCB which interconnect the signal pins of the components) is a valuable resource.

One prior art method of increasing the PCB area available for the signal interconnect, or trace, routing is to combine multiple boards, each having one or more trace conductor patterns, into a single multilayer PCB. This is achieved by gluing (laminating) several double-sided boards together with insulating layers in between. The number of layers is referred to as the number of separate trace conductor patterns. Most mother boards have between 4 and 8 layers, but PCBs with almost 100 layers have been made. The large number of layers facilitate or enable the fan out and routing of a large number of signal traces for a correspondingly large number of integrated circuit components.

A problem exists however, in the use of multilayer PCBs. Since each layer is fabricated using a separate etching process, each added layer adds to the expense of the overall PCB. Additionally, since each layer must be glued or otherwise combined with the other layers, the process of combining the layers adds to the expense and also increases the chances of introducing flaws into the finished PCB.

Another problem exists in the fact that interconnections between the layers of a PCB are implemented using "vias" which penetrate the trace conductor patterns of one layer to form a connection with the trace conductor patterns of another layer. Such vias waste space that could otherwise be used to route other signal traces. This can be particularly problematic in the case of a complex integrated circuit component having several hundred signal traces which must be routed. For example, where a microprocessor chip has a surface mount array of connections for 500 or more signal traces, such a chip forces designers to implement PCBs having many layers (e.g., four or more) simply to allow the signal traces from the inside of the ball surface mount array to escape past the signal traces on the outside of the array.

The traditional disposition of vias across a PCB is a dominant obstruction that can consume PCB real estate for trace routing. The placement of vias is 'expensive' in terms of trace routing since it consumes space that would otherwise be used for routing 4, 5, or even 6 traces. This problem exists for each layer of the PCB through which vias must be implemented. A designer's ability to cope with this problem is limited by conventional PCB fabrication design rules and via construction technology (e.g., which allocates a standard spacing per via, etc.).

Because of these reasons, conventional prior art routing limitations dictate that vias are regularly placed at the same pitch as their connecting ball. In other words, generally, only a minimal number of traces (e.g., one) can be routed between the vias. Every line (or row) of vias, in addition to the outer 2 rows requiring vias, requires a dedicated escape routing layer.

In addition to the problem of stifling the space to route the signal traces out from a surface mount array (typically of pins, but also any form of surface mount connection) to surrounding devices, the vias also have a severe impact on the layers in the PCB construction that are used to deliver the power into the IC. These layers (referred to as planes) not only carry power but also provide a path for transmission line return currents flowing between the IC and another device. The degradation of this copper plane caused by holes around the vias, limits how much power can be delivered and how fast the high-speed signals can transition.

For any form of PCB requiring a surface mount array pattern of connections consisting of many (e.g., 5, 6, or more) rows, what is required is a solution that can reduce the number of PCB layers required to implement interconnections for complex integrated circuit components. What is required is a solution that minimizes the impact of vias between layers of the PCB on the trace routing of the PCB. Additionally, what is required is a solution capable of functioning with conventional design rules and via construction technology for the fabrication of PCBs. The present invention provides a novel solution to the above requirements.

SUMMARY OF THE INVENTION

Embodiments of the present invention provide a system for arraying any surface mount grid array of contact pads and their connecting vias to optimize trace escape routing in the printed circuit board (PCB). Embodiments of the present invention can reduce the number of PCB layers required to implement interconnections for complex integrated circuit components. Embodiments of the present invention minimize the impact of vias between layers of the PCB on the trace routing of the PCB. Additionally, embodiments of the present invention are capable of functioning with conventional design rules and via construction technology for the fabrication of PCBs.

In one embodiment, the present invention is implemented as a BGA (ball grid array) package implemented on a PCB optimized for trace escape routing for the PCB. The invention, however, is not only limited to this embodiment, but is applicable to any similar PCB based implementation of surface mount grid arrays. For example, it applies to BGA substrate ball pattern arrays connecting the solder balls back to the die. It also applies to the connection of a 'bump array' (connecting to the surface of a flip-chip die) to the interconnect of the BGA substrate itself. In this embodiment, the BGA footprint includes a plurality of connection blocks, with each connection block including an array of contact pads, and an array of vias, wherein the pads and vias are configured to communicatively connect an integrated circuit device to a plurality of traces of the PCB. The connection blocks are disposed in a tiled arrangement, wherein the connection blocks implement a plurality of trace escape channels along connection block boundaries. The trace escape channels are configured for routing traces from inner pads of the BGA footprint to a periphery of the BGA footprint.

In one embodiment, the array of pins and the array of vias of the connection blocks are configured to replace at least one pin with one via to ensure the tiled arrangement.

In one embodiment, the array of pins of the BGA footprint is a 3×2 array of pins and the array of vias of the BGA footprint is a 2×3 array of vias.

In this manner, the trace escape channels minimize the impact of the vias on the trace escape routing of the PCB, thereby allowing a trace escape routing pattern from an integrated circuit device to be implemented with fewer PCB layers in comparison to the prior art. The reduction in the number of PCB layers required leads to a corresponding reduction in the cost of the resulting PCB, and a corresponding increase in the reliability of the resulting PCB. Additionally, the use of trace escape channels provide an added degree of trace escape route ability, thereby allowing the use of conventional design rules and via construction technology for the fabrication of PCBs, and eliminating any requirement for exotic or overly expensive PCB fabrication technology.

The present invention also improves the arrangement of via holes in the copper planes, in the direction of current flow. In one embodiment, such an arrangement of via holes in the direction of current flow yields 5 times the amount of copper for DC or AC transient power supply and for high-speed signal return paths.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 shows a ball grid array on a surface (e.g., the underside) of an integrated circuit device in accordance with one embodiment of the present invention.

DETAILED DESCRIPTION OF THE INVENTION

Figure 2:
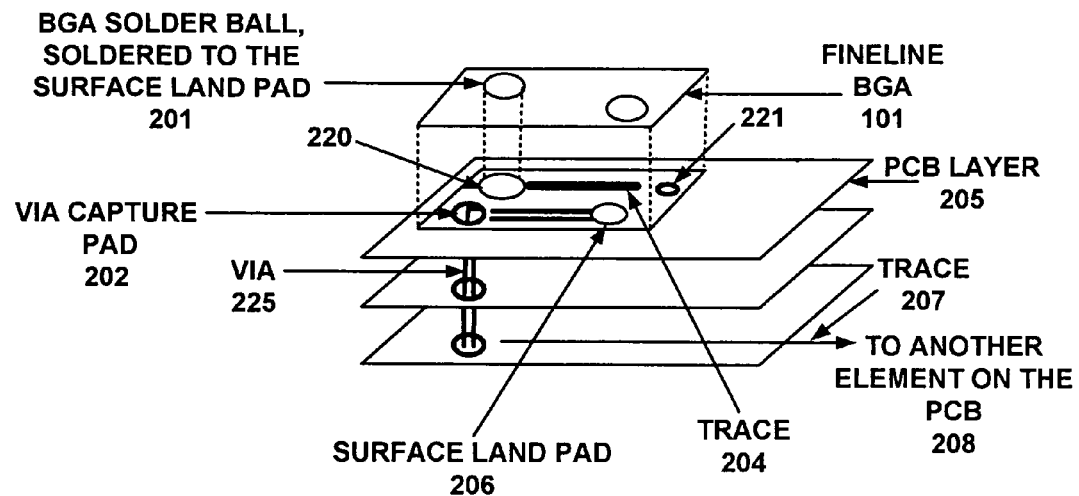
FIG. 2 shows a diagram depicting the means by which signal traces are connected to the number of connection balls of the ball grid array in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention provide a system for arraying surface mount grid array (e.g., ball grid array, pin array, or the like) contacts to optimize trace escape routing for a printed circuit board (PCB). The trace escape routing provided by embodiments of the present invention is applicable to any similar PCB based implementation of surface mount grid arrays. For example, the trace escape routing applies to BGA substrate ball pattern arrays connecting the solder balls back to the die. The trace escape routing also applies to the connection of a 'bump array' (connecting to the surface of a flip-chip die) to the interconnect of the BGA substrate itself, or to an array of pins (e.g., a PGA or pin grid array). Embodiments of the present invention can reduce the number of PCB layers required to implement interconnections for complex integrated circuit components. Embodiments of the present invention minimize the impact of vias between layers of the PCB on the trace routing of the PCB. Additionally, embodiments of the present invention are capable of functioning with conventional design rules and via construction technology for the fabrication of PCBs. Embodiments of the present invention and their benefits are further described below.

Figure 1:
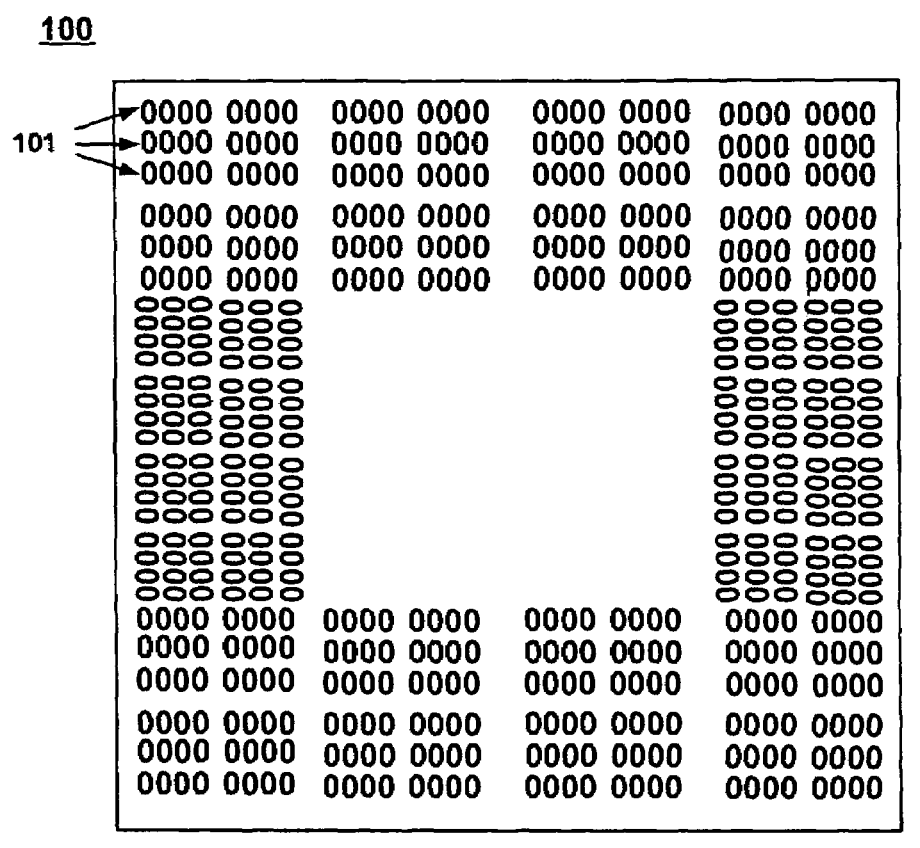

FIG. 1 shows a ball grid array 100 on a surface (e.g., the underside) of an integrated circuit device in accordance with one embodiment of the present invention. As depicted FIG. 1, the ball grid array 100 includes a large number of connection balls (e.g., connection balls 101), or alternatively, connection pads, for connecting internal signals of the integrated circuit device with surface lending pads, or alternatively, pad receivers, of a ball grid array package of a printed circuit board.

As known by those skilled in the art, the ball grid array 100 of the integrated circuit device provides the means by which internal signals of the integrated circuit device are coupled to a PCB. Many integrated circuit devices can include hundreds of connection balls 101 (e.g., 500 or more). The efficient routing of signal traces from the connection balls 101 is an important function of the ball grid array package of the PCB. The signal traces must be efficiently routed from balls on the inside (e.g. near the center of the integrated circuit device) of the ball grid array 100 without interfering with the signal traces routed from balls on the outside of the ball grid array 100.

FIG. 2 shows a diagram 200 depicting the means by which signal traces are connected to the number of connection balls 101 of the ball grid array 100 in accordance with one embodiment of the present invention. Diagram 200 shows a ball grid array solder ball 201 on the surface of the integrated circuit device and its associated surface landing pad 220. A trace 204 is used to connect the surface landing pad 220 and 206 to via capture pads 221 and 202. The via capture pads 221 and 202 implement vias (e.g., via 225) which go through layers of the PCB (e.g., PCB layer 205) to route signals from the capture pads to traces (e.g., trace 207) of the trace conductor patterns of a PCB layer.

Figure 3:
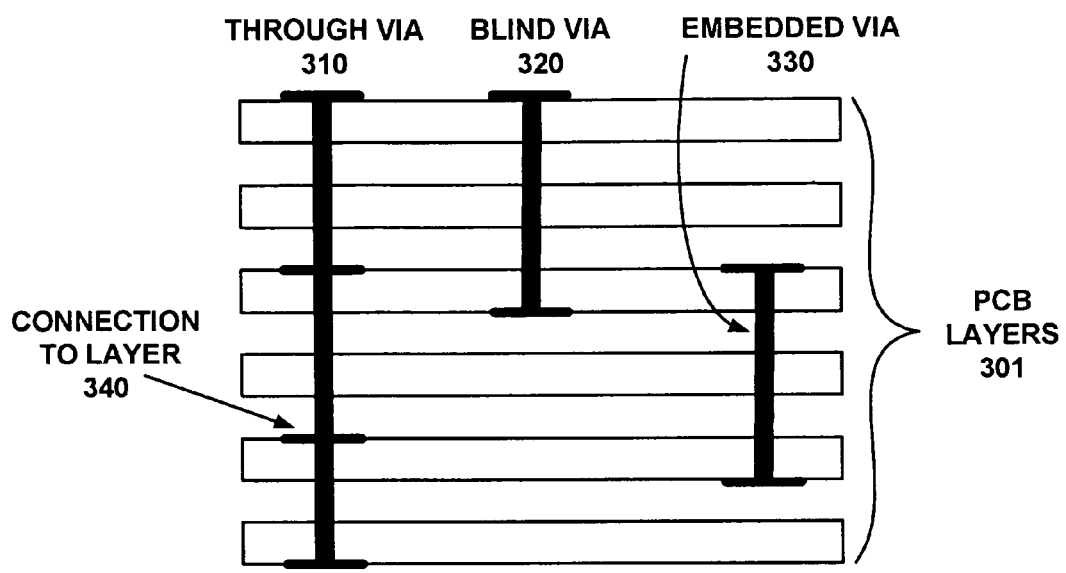
FIG. 3 shows a diagram depicting the implementation of different types of vias through multiple layers of the PCB in accordance with one embodiment of the present invention.

FIG. 3 shows a diagram 300 depicting the implementation of different types of vias through multiple layers of the PCB in accordance with one embodiment of the present invention. As depicted in FIG. 3, six PCB layers 301 are shown. A through via 310, as shown in diagram 300, proceeds from an upper PCB layer all the way through to the underside of the lowest PCB layer. A blind via 320, proceeds from an upper PCB layer 2 and an embedded PCB layer, as shown. An embedded via 330 proceeds from one embedded PCB layer through to a second embedded PCB layer. Each via type implements connections between layers through a layer connection 340.

Thus, FIGS. 1, 2, and 3 show the manner in which connection balls of a ball-grid array are used to route signals to the PCB. As shown in FIG. 3, multilayer PCBs have become an industry standard. Integrated circuit device BGAs, with their matrix of solder balls across the bottom of the chip, can use multi-layer PCB technology for escape routing. Escape routing refers to the method used to route each signal from a chip to another element on the PCB. In multi-layered PCBs, signals are routed from the inner balls of the BGA package to various elements on the PCB through vias (or plated through-holes), which provide electrical connections between various PCB layers as shown in diagram 300.

Figure 4:
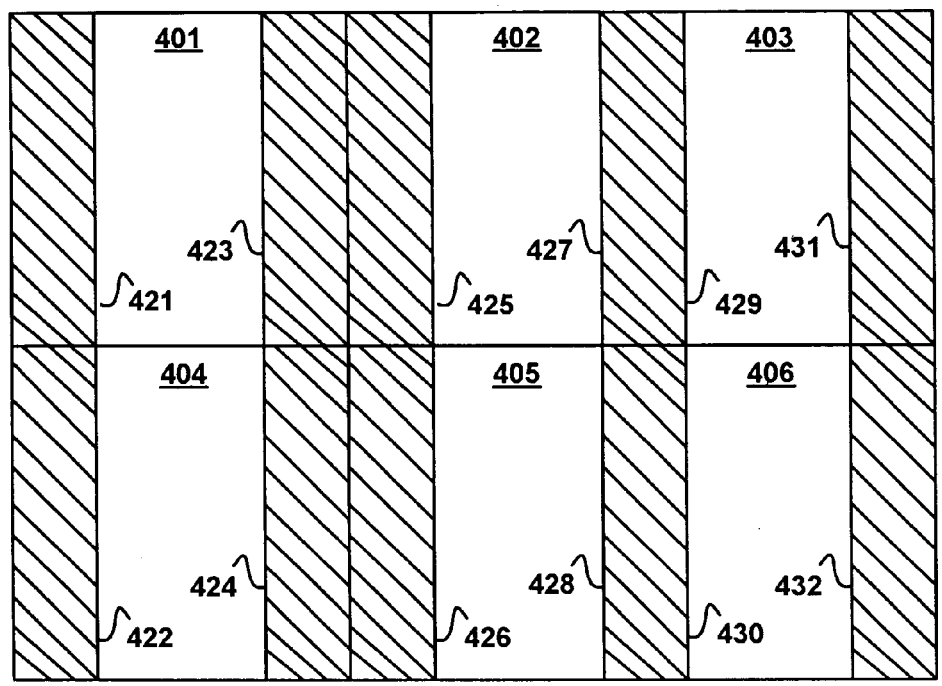
FIG. 4 shows a diagram of a BGA (ball grid array) package footprint implemented on a PCB optimized for trace escape routing for the PCB in accordance with one embodiment of the present invention.
Figure 5:
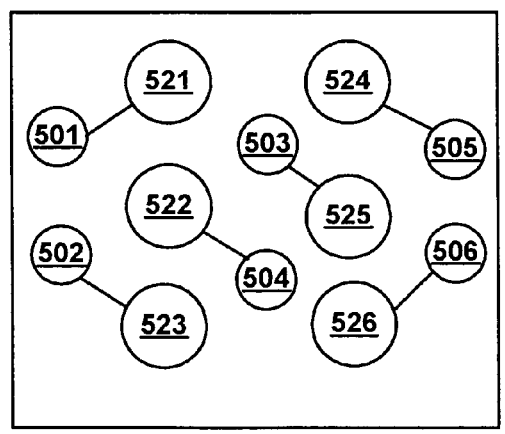
FIG. 5 shows a diagram of one connection block in accordance with one embodiment of the present invention.

FIG. 4 shows a diagram of a BGA (ball grid array) package footprint 400 implemented on a PCB optimized for trace escape routing for the PCB in accordance with one embodiment of the present invention. In this embodiment, the footprint 400 includes a plurality of connection blocks, 6 of which are shown (connection blocks 401–406), with each connection block including an array of contact pads, and an array of vias (as shown in FIG. 5 below), wherein the pads and vias are configured to communicatively connect an integrated circuit device to a plurality of traces of the PCB. In this embodiment, the connection blocks 401–406 are disposed in a tiled arrangement, wherein the connection blocks implement a plurality of trace escape channels 421–432 along connection block boundaries. The trace escape channels 421–432 are configured for routing traces from inner pads of the BGA footprint to a periphery of the BGA footprint.

FIG. 5 shows a diagram of one connection block 500 in accordance with one embodiment of the present invention. As depicted in FIG. 5, the connection block 500 includes an array of pins, or contact pads, comprising the pins 501–506, and an array of vias comprising the vias 521–526. As shown in FIG. 5, the pins along the left side (pins 501 and 502) and right side (pins 505 and 506) of the connection block 500 are connected towards the center of the connection block in order to keep the boundaries of the connection block 500 free of any vias which might interfere with the routing of traces through the trace escape channels.

Figure 6:
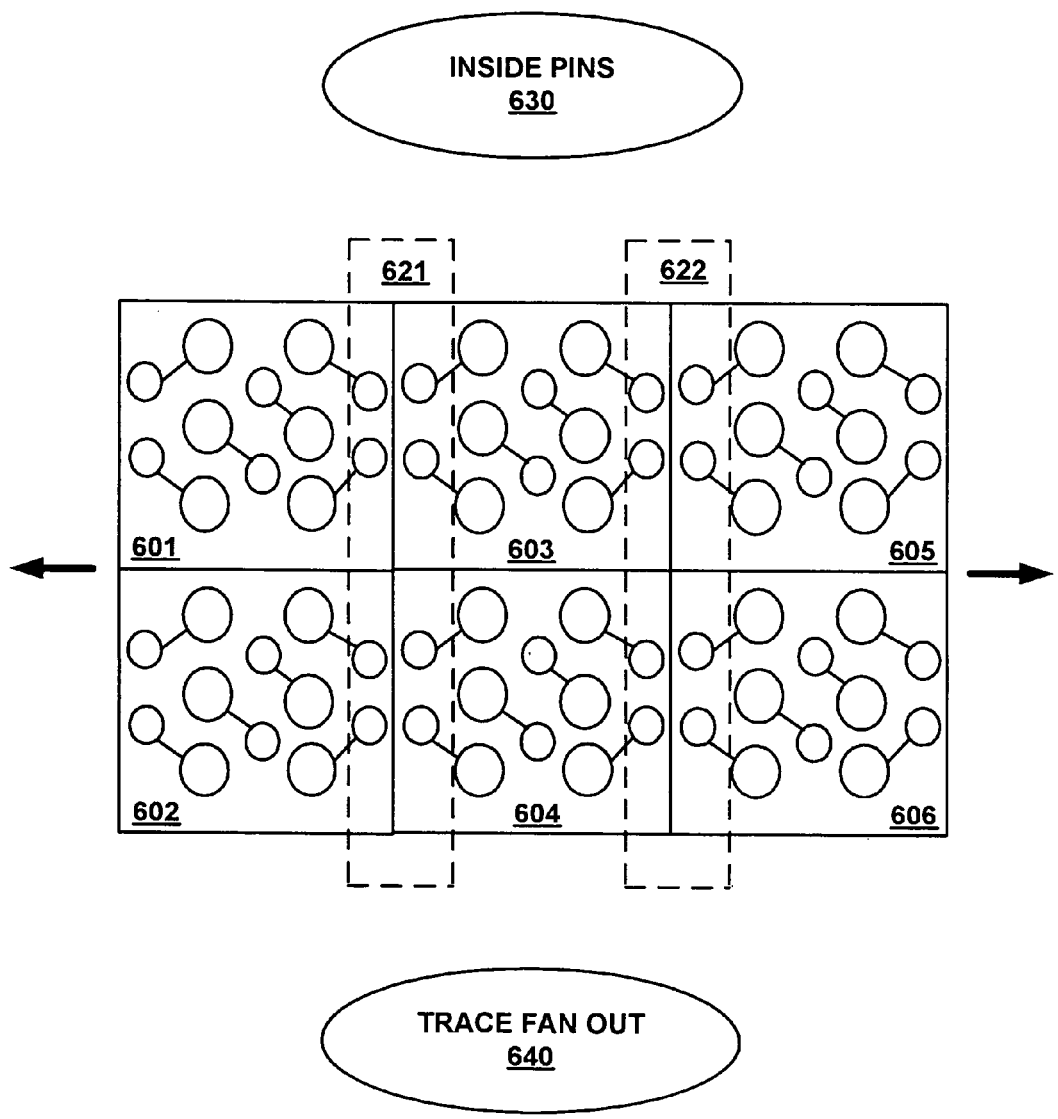
FIG. 6 shows a diagram of a set of connection blocks of a BGA package as they implement trace escape channels in accordance with one embodiment of the present invention.

FIG. 6 shows a diagram of a set of connection blocks 601–606 of a BGA footprint as they implement trace escape channels in accordance with one embodiment of the present invention. As described above, the array of connection pads and the array of vias of the connection blocks keep the trace escape channels 621–622 clear in order to route signal traces from the inside pads 630 to the trace fan out region 640 of a PCB layer. In the present embodiment shown in FIG. 6, the array of pads of the BGA package is a 3×2 array of pads and the array of vias of the BGA package is a 2×3 array of vias.

In accordance with the present embodiment, the trace escape channels 621–622 increase the area available for routing traces from the inside pads 630 to the trace fan out 640 while maintaining the minimum width of the traces and the minimum space required between traces. The minimum space required for signal routing is the smallest space the signal must be routed through (e.g., the distance between two vias). The number of traces that can be routed through this space is based on the permitted line trace and space widths. For example, if the permitted line trace width is 4 mils and the space width is also 4 mils, the total space required is 12 mils (i.e., space width+trace width+space width). The trace escape channels 621–622 increase the space available for the escape routing. In the present embodiment, the array of pins are disposed with a 1 mm pitch (e.g., also other pitches can be implemented).

Thus, by increasing the space available on a given layer for escape routing, embodiments of the present invention to reduce the number of PCB layers required for routing a given integrated circuit device.

Additionally, embodiments of the present invention are capable of functioning with conventional design rules and via construction technology for the fabrication of PCBs. As discussed above, the trace escape channels 621–622 increase the space available for the escape routing. The use of trace escape channels in accordance with embodiments of the present invention can triple the number of traces that can be routed from inside pads 630 to the fan out 640 in comparison to prior art implementations. Alternatively, viewed from a different aspect, the use of trace escape channels in accordance with embodiments of the present invention can reduce the number of required routing layers by a factor of 3.

The added trace escape routing efficiency of the embodiments of the present invention enabled the use of conventional PCB fabrication technology using conventional design rules and conventional via construction technology. No exotic or overly-specialized PCB fabrication techniques are required.

Referring still to FIG. 6, it should be noted that in the opposite direction to the signal interconnect flows the power supply current to the "core array" of the BGA package, typically in the center of the BGA package where the integrated circuit die is located. It is important to create adequate copper between the vias to sustain the peak transient currents required by the device. In a modern high complexity ASIC (application-specific integrated circuit), this current flow will be hampered by a conventional prior art-type via grid. The embodiments of the present invention can create on the order of five times the amount of copper between the vias for dc and ac transient power supply current flow as well as clean signal return paths.

It should be noted that embodiments of the present invention are equally applicable to solving similar routing congestion in the PCB construction in the BGA substrate itself and even more so to flip chip RDL (die pad Re-Distribution Layer) routing. RDL routing presents an array of bumps on the surface of a flip chip die to enable the flip chip die to attach to a package surface. The pads adjacent to the "bump array" require the same type of routing efficiency as in the PCB application described above.

Figure 7A:
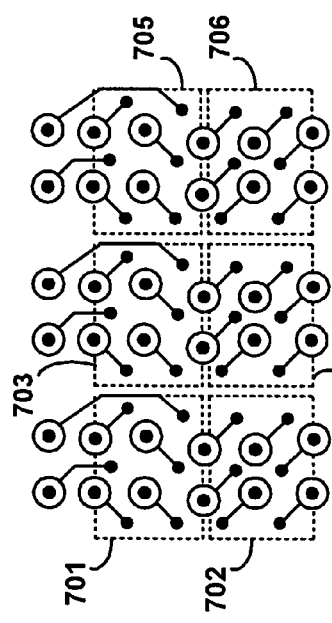
FIG. 7A shows a tiled arrangement of 3×2 blocks and trace escape channels in accordance with one embodiment of the present invention.
Figure 7B:
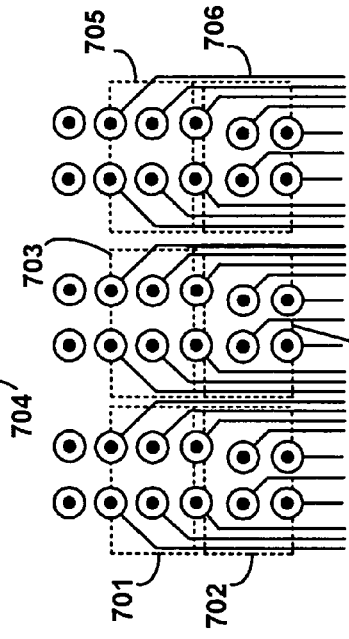
FIG. 7B shows a diagram depicting the manner in which trace escape channels between the blocks allow traces from vias to be routed through the area between the blocks in accordance with one embodiment of the present invention.
Figure 7C:
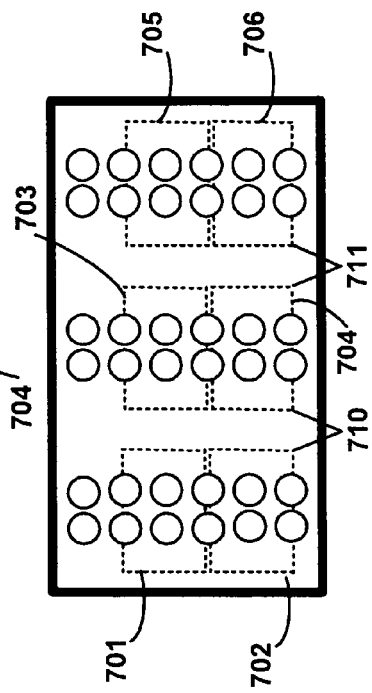
FIG. 7C shows a diagram depicting the trace escape channels implemented between blocks in accordance with one embodiment of the present invention.

FIGS. 7A through 7C show diagrams of a tiled set of 3×2 blocks and the trace escape channels implemented between them in accordance with one embodiment of the present invention. FIG. 7A shows a tiled arrangement of the 3×2 blocks 701–706. FIG. 7A also shows the offset arrangement between the blocks of adjacent rows, such as the relationship between blocks 701, 703, and 705 and the next row blocks, blocks 702, 704, and 706. FIG. 7B shows how the trace escape channels between the blocks, as described above, allow traces from the vias to be routed through the area between the blocks. This aspect is depicted more clearly in FIG. 7C, or the trace escape channels 710 and 711 are indicated.

Figure 8A:
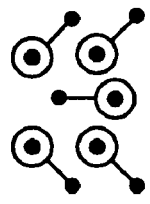
FIG. 8A shows a first implementation of a 3×2 block pattern in accordance with one embodiment of the present invention.
Figure 8B:
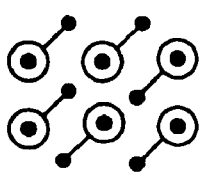
FIG. 8B shows a second implementation of a 3×2 block pattern in accordance with one embodiment of the present invention.
Figure 8C:
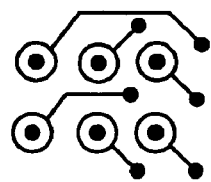
FIG. 8C shows a third implementation of a 3×2 block pattern in accordance with one embodiment of the present invention.

FIGS. 8A through 8C show three exemplary implementations of a 3×2 block pattern in accordance with embodiments of the present invention. Each of the FIGS. 8A–C show patterns 801–803 wherein the vias are coupled to the pins. In each case, the objective is to define a pattern that will tile effectively for large arrays, while simultaneously maintaining a via free trace escape channel between adjacent blocks, as in FIG. 7C above.

Figure 10:
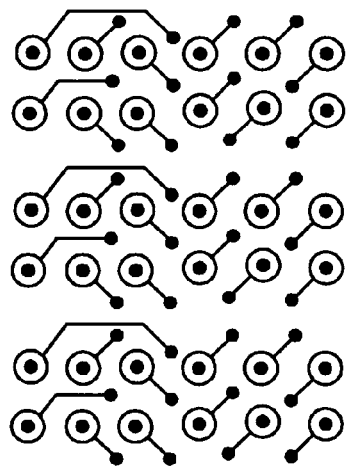
FIG. 10 shows a second implementation of 3×2 blocks arranged in a tiled pattern in accordance with one embodiment of the present invention.
Figure 11:
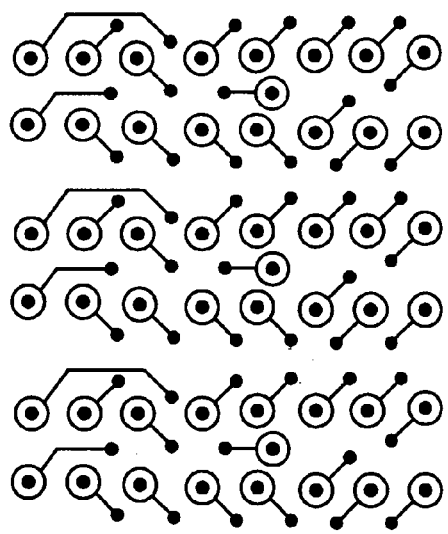
FIG. 11 shows a third implementation of 3×2 blocks arranged in a tiled pattern in accordance with one embodiment of the present invention.
Figure 9:
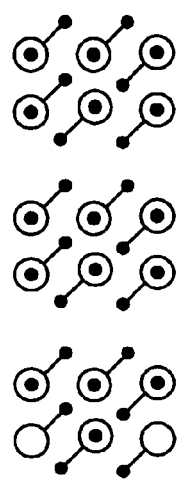
FIG. 9 shows a first implementation of 3×2 blocks arranged in a tiled pattern in accordance with one embodiment of the present invention.

FIGS. 9 through 11 show three exemplary implementations of 3×2 blocks arranged into tiled patterns in accordance with embodiments of the present invention. FIG. 9 shows a pattern 900 of multiple 3×2 blocks arranged for two rows (of pins) of trace escape routing as shown. FIG. 10 shows a pattern 1000 of multiple 3×2 blocks in-line and offset used for four rows of trace escape routing. FIG. 11 shows a pattern 1100 of multiple 3×2 blocks in-line with skip locations (e.g., some pins replaced by vias) used for 6 rows of trace escape routing. In each of these patterns 900–1100, the arrangement of the via to pin connections are disposed to keep the trace escape channels free of vias which might obstruct the trace escape routing from the inside pins to the trace fan out. With respect to pattern 1100 of FIG. 11, although some pins have been replaced by vias, the pattern 1100 embodiment can still reduce the number of PCB layers required, since the trace escape channels still allow trace escape routing from the inside pins to the trace fan out in a much more efficient manner in comparison to the prior art.

Thus, embodiments of the present invention provide a system for arraying ball grid array contact pads to optimize trace escape routing for a printed circuit board (PCB). Embodiments of the present invention can reduce the number of PCB layers required to implement interconnections for complex integrated circuit components. Embodiments of the present invention minimize the impact of vias between layers of the PCB on the trace routing of the PCB. Additionally, embodiments of the present invention are capable of functioning with conventional design rules and via construction technology for the fabrication of PCBs.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A surface mount grid array of connections for a PCB (printed circuit board), optimized for trace escape routing with respect to the PCB, and comprising:

a plurality of connection blocks, each connection block including an array of pins and an array of vias, wherein the pins and vias are configured to communicatively connect an integrated circuit device to a plurality of traces of the PCB; and the connection blocks disposed in a tiled arrangement, wherein the connection blocks implement a plurality of trace escape channels along connection block boundaries, wherein pins along the connection block boundaries are connected to vias toward a center of each respective connection block, and wherein the trace escape channels are configured for routing traces from inner pins of the surface mount grid array to a periphery of the surface mount grid array.

2. The surface mount grid array of claim 1 wherein the array of pins is a 3×2 array of pins and the array of vias is a 2×3 array of vias.

3. The surface mount grid array of claim 2 wherein the 3×2 array of pins a disposed offset from the 2×3 array of vias.

4. The surface mount grid array of claim 1 wherein the tiled arrangement is sustained through a plurality of rows to create an open channel for power delivery on at least one PCB layer.

5. A BGA (ball grid array) package having a plurality of trace escape channels for routing signal traces on a PCB (printed circuit board), comprising a plurality of connection blocks disposed to implement a plurality of trace escape channels along connection block boundaries, wherein pads along the connection block boundaries are connected to vias toward a center of each respective connection block, wherein the trace escape channels are configured for routing signal traces from inner pads of the BGA package to a periphery of the BGA package, each connection block including an array of pads and an array of vias, wherein the pads and vias are configured to communicatively connect and integrated circuit device to a plurality of traces of the PCB without pads sharing vias.

6. The BGA package of claim 5 wherein the array of pads is a 3×2 array of pads and the array of vias is a 2×3 array of vias.

7. The BGA package of claim 5 wherein a tiled arrangement is sustained through a plurality of rows to create an open channel for power delivery on at least one PCB layer.

8. A system for implementing optimized for trace escape routing for an integrated circuit device, comprising:
   a PCB (printed circuit board) for mounting an integrated circuit device;
   a PGA (pin grid array) package implemented on the PCB for connecting the integrated circuit device to the PCB;
   a plurality of connection blocks includes in the PGA package, each connection block including an array of pins and an array of vias, wherein the pins and vias are configured to communicatively connect an integrated circuit device to a plurality of traces of the PCB; and
   the connection blocks disposed in a tiled arrangement in the PGA package, wherein the connection blocks implement a plurality of trace escape channels along connection block boundaries, wherein pins along the connection block boundaries are connected to vias toward a center of each respective connection block, and wherein the trace escape channels are configured for routing traces from inner pins of the PGA package to a periphery of the PGA package.

9. The system of claim 8 wherein the array of pins is a 3×2 array of pins and the array of vias is a 2×3 array of vias.

10. The system of claim 8 wherein the tiled arrangement is sustained through a plurality a plurality rows to create an open channel for power delivery on at least one PCB layer.

* * * * *